July 25, 1967 A. M. WEISMAN 3,333,156

MODULAR PRINTED CIRCUIT BOARD RACK WITH IMPROVED CARD GUIDE

Filed Dec. 1, 1965 2 Sheets-Sheet 1

INVENTOR.
ARNOLD M. WEISMAN

BY R. E. Geauque

ATTORNEY

ARNOLD M. WEISMAN
INVENTOR.

BY R. E. Geauque

ATTORNEY

United States Patent Office 3,333,156
Patented July 25, 1967

3,333,156

MODULAR PRINTED CIRCUIT BOARD RACK WITH IMPROVED CARD GUIDE

Arnold M. Weisman, Los Angeles, Calif., assignor to The Birtcher Corporation, Los Angeles, Calif., a corporation of Virginia Filed Dec. 1, 1965, Ser. No. 510,865
15 Claims. (Cl. 317—101)

This invention relates to racks or holders for retaining or storing printed circuit boards or cards and, more particularly, to a novel modular rack that may be readily assembled in conjunction with multiple circuit board electrical receptacles whereby a plurality of circuit boards may be readily placed into and out of circuit relationship therewith.

Modular hardware has been used in the electronic industry due to its inherent flexible features which allow the hardware to be utilized in electronic circuit applications that vary considerably from one another since the hardware eliminates complex sheet metal work, unreliable connector alignments, and involved wiring harnesses. The use of such mass produced modular hardware then minimizes the expense of packaging of electronic systems.

However, difficulties have been encountered when employing modular printed circuit board holders or racks which stem largely from the fact that the electrical terminals carried by the printed circuit board must be accurately aligned with the electrical connectors or receptacles into which they are to be connected so that the circuitry carried by the card is placed in proper circuit relationship with respect to electrical circuits carried thereon or carried on other circuit boards included in the overall circuit. The alignment problems are serious since a slight misalignment prevents ready entry of a circuit board into its connector and even more difficulty in their removal sometimes requiring a large amount of force to be used leading to breakage of the circuit card itself. These alignment problems lead to high manufacturing costs. Furthermore, the circuit boards or cards themselves should be readily insertable into the holder or rack in such a fashion that the card will not be damaged or worn so that repeated insertion of the card in its mounting will not result in looseness or lack of retention.

Accordingly, the novel rack of the present invention provides a pair of end plates between which are supported a plurality of modular components including multiple sets of card guides having tracks or slots therein separated by individual spacers and including sets of connector brackets to which suitable electrical connectors may be attached in such a fashion that the receptacle carried on the connector is in direct alignment with the card retention slots provided in the guides to insure alignment of the card carrying terminals with the respective receptacles carried on the connector. A feature of the present invention resides in the fact that the card guides, spacers and connector brackets are supported from the side plates by means of a suitable rod supporting means which when the modular components have been properly arranged thereon, may be cinched down to retain the modular components in proper alignment and position to complete a unitized rack for releasably receiving a plurality of printed circuit cards or boards.

Therefore, it is a primary object of the present invention to provide a novel printed circuit card or board rack which includes a relatively small number of modular components which may be readily assembled on a supporting frame whereby alignment of insertable circuit cards with individual receptacle type electrical connectors is assured.

Still another object of the present invention is to provide a novel rack for packaging a plurality of printed circuit cards which may be simply constructed by stacking selected modular hardware components such as spacers, connector brackets, and guides on supporting rods between a pair of side plates to achieve a unitized electronic circuit board holder.

Another object of the present invention is to provide a novel circuit board or card holder which offers an improved card guide having a track or slot entrance or throat thereto which assures quick insertion of a particular circuit card into the guide and which will not damage the guide or card after repeated insertions thereof.

Still a further object of the present invention is to provide a novel card packaging means for electronic systems wherein the guide means for the individual cards includes antifriction means permitting easy ingress and egress of the circuit cards from the guide as well as to provide proper retention of the particular cards within the supporting guide means.

Still another object of the present invention is to provide a novel card storage rack for printed circuit boards or cards which includes a variety of modular hardware elements which may be readily assembled to accommodate multi-tiers of printed circuit boards or cards for multiple-row assembly.

Yet another object of the present invention is to provide a novel card guide employed in a modular multi-printed circuit board holder which may be either insulated or non-insulated and which may be employed for single or multiple row assembly.

A further object of the present invention resides in the employment of adjustable spacers operable between adjacent card guides in a printed circuit board or card holder which may be readily employed to adjust the space or distance between the adjacent card guides so as to maximize high density storage of the circuit cards as well as to assure alignment of the cards with the receptacle of an electrical connector.

Still another feature of the present invention resides in the provision of a novel printed circuit board or card holder which may be employed to readily align the printed circuit card with mating electrical connector receptacles carried on a separate master board in such a fashion that alignment between the cards and receptacles is assured.

Features of the present invention which are believed to be novel are set forth with particularity in the appended claims. The invention, both as to its organization and manner of operation, together with further objects and advantages thereof, may best be understood by reference to the following description, taken in connection with the accompanying drawings, in which:

Figure 1:
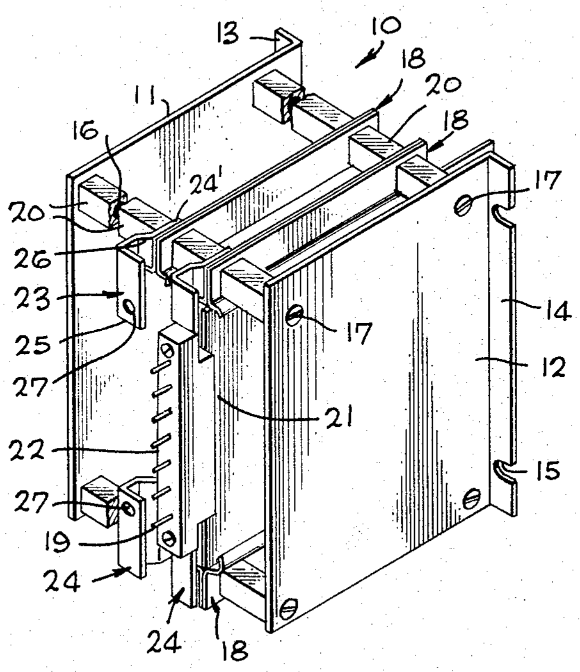
FIGURE 1 is a perspective view of a novel holder for printed circuit boards or cards constructed from modular components.
Figure 9:
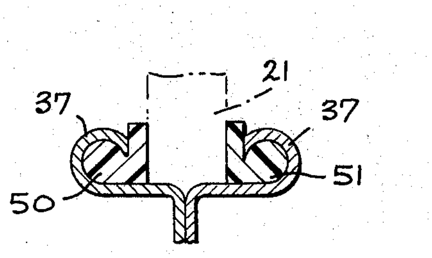
Figure 10:
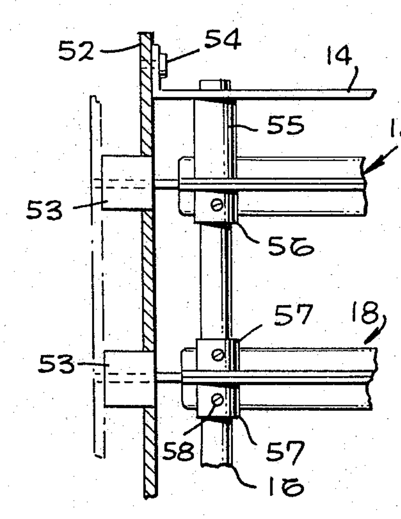

FIGURE 9 is an enlarged sectional view of the card guide means including anti-friction means therefor located within the guide track; and FIGURE 10 is a fragmentary elevational view of the novel adjustable spacer means which may be incorporated into the printed circuit card holder of FIGURE 1 and further illustrating an adaptation of the printed circuit card holder in conjunction with a plurality of receptacle type electrical connectors mounted on a separate master or "mother" board.

Figure 2:
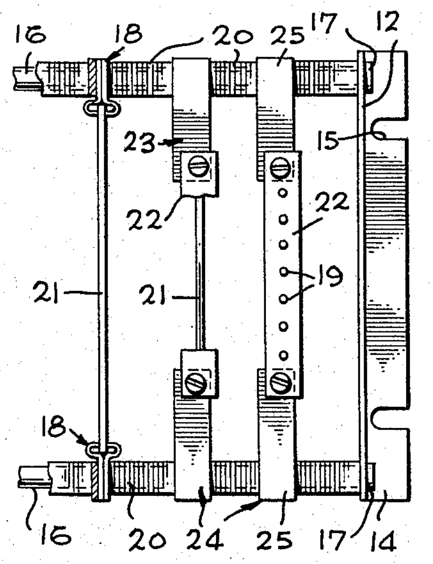
FIGURE 2 is a front elevational view of the holder or rack shown in FIGURE 1.

Referring now to the drawings, the structure for each of the modular elements allowing them to be assembled together to form a composite modular assembly or receptacle for storing and retaining printed circuit boards will be described. Basically, as shown in FIGURES 1 and 2, the modular hardware making up the composite circuit card holder in accordance with the present invention is illustrated in the direction of arrow 10 which comprises a pair of spaced apart side plates 11 and 12 arranged in parallel and between which a variety of individual modular elements are supported. Each of the side plates includes a mounting flange 13 and 14 which are integrally formed from its respective side plate at a right angle to the face thereof and includes mounting notches, such as notch 15, through which suitable fasteners may be attached for securing the assembled rack to a cabinet or the like. Inasmuch as the conventional circuit board or card is of rectangular configuration, the side plates are also formed to take the general shape of a rectangle whereby supporting rods, such as the rod 16 as illustrated in FIGURE 2, are attached in the vicinity of each corner by means of a suitable fastener, such as screw 17.

The modular elements mountable on the upper pair of rods are the same as the modular elements mounted on the lower pair of support rods so that for the purposes of describing the present invention, only those elements carried on support rod 16 will be described. The support rods are employed for supporting a plurality of rigid non-snappable card guides, such as guide 18, which are arranged in fixed space relationship between the side plates and which are maintained in this relationship by means of a plurality of spacers, such as spacer 20. The spacers are preferably composed of a plastic-like electrically non-conductive material so as to lighten the weight of the assembly. However, for strength, the spacers may also be made of metal such as aluminum for example.

Each card guide of the plurality including the upper and lower guides, includes a longitudinal slot or track formed therein into which the end of a circuit board or card, such as card 21, may be received. Details of the card guide will be more fully described later with respect to the discussion of FIGURES 7 and 8. It is to be noted that a connector 22 is mounted in alignment with the slots or tracks of the upper and lower card guides and therefore in similar alignment with the card per se by means of an upper connector bracket 23 and a lower connector bracket 24.

To simplify the illustration of the invention in the corresponding description, the printed circuit card 21 and its associated electrical components are not shown. Also, in this connection, it should be understood that the electrical connector 22 is a conventional, commercially available connector and, for the purposes of this invention, it merely need be noted that it includes a socket or receptacle portion to receive one edge of the circuit card whereby the electrically conductive portions on the circuit card will be aligned with the respective electrical terminals 19 for the connector.

Figure 3:
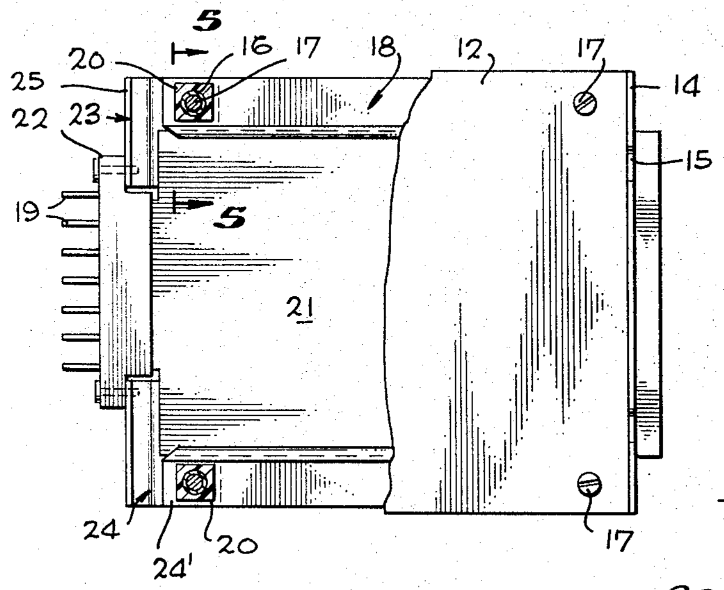
FIGURE 3 is a side elevational view, having a portion thereof broken away, of the printed circuit card holder shown in FIGURES 1 and 2.

With respect to FIGURES 1–3 inclusive, it should be noted that each connector bracket includes a rigid body portion 24' which is mounted on the support rod 16 via a hole in the body portion from which an attachment flange 25 is cantilevered therefrom via an integral link 26.

The attachment flange includes a mounting aperture 27 suitable for receiving a conventional fastener for holding one end of the connector 22 thereto. The connecting link 26 is so formed with respect to the body 24 that the mounting or attachment flange 25 lies in the same vertical plane as the upper and lower card guides so that when the connector 22 is properly mounted between the upper and lower connector brackets, the socket portion of the connector is in proper alignment to receive the edge of the inserted printed circuit card. For purposes of clarity, one set of upper and lower connector brackets are shown in FIGURE 1 without the attachment of the connector 22 therebetween.

Figure 4:
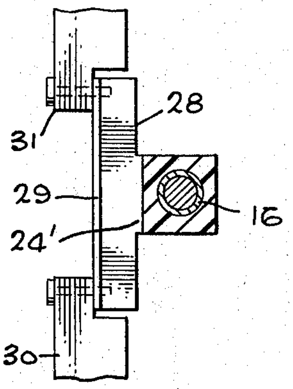
FIGURE 4 is an enlarged elevational view of a connector bracket useful in a multi-tier arrangement of printed circuit boards.

Referring now to FIGURE 4, an adaptation of the present invention is shown whereby rigid connector brackets may be employed, such as bracket 28 which extends above the supporting rod 16 as well as below so as to accommodate the mounting of connectors on the opposite ends of its attachment flange 29 when it is desirable to have a multi-tiered assembly of printed circuit boards. One tier or row of circuit boards would be associated with the connector 30 while a lower row of tiers of circuit boards would be associated with the connector 31. The opposite ends of the flange 29 are provided with apertures to receive suitable fasteners for attaching the ends of adjacent connectors thereto. Furthermore, the body 24 of the bracket is formed with a hole for mounting onto the support rod 16.

Figure 5:
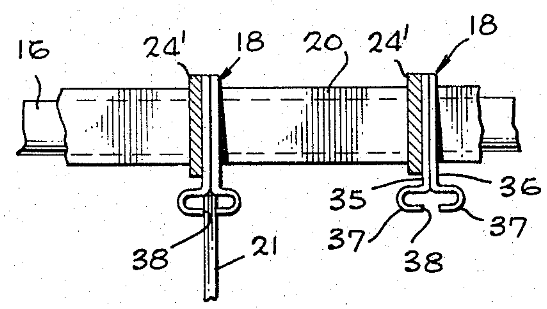
FIGURE 5 is an enlarged elevational view of the card guide means illustrated in FIGURE 3 as taken in the direction of arrows 5—5 thereof.
Figure 6:
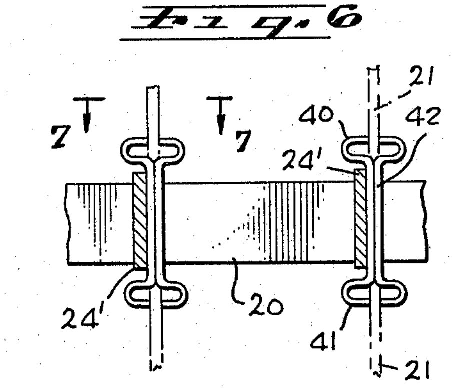
FIGURE 6 is a view similar to FIGURE 5 illustrating multiple tiers and rows of card guide means employed in a holder for stacking printed circuit cards.

The card guide as illustrated in FIGURE 3 is shown in an enlarged form in FIGURE 5 for application in a single row or tier of printed circuit cards. The guide 18 is preferably constructed from a pair of elongated rigid members 35 and 36 which are fabricated from a suitable metal material and are joined together by any suitable means such as welding, soldering, or the like. Each member is formed with an arcuate portion 37 that flares outwardly and then inwardly so that a track or slot 38 is defined between the opposite terminal ends of the arcuate portions. The track width is such that the width of a conventional printed circuit board can readily slide into and out of communication therewith. However, in the case of a multi-tiered assembly, the card guide may take the form of the embodiment shown in FIGURE 6 whereby a single guide is employed having identical guide track means 40 and 41 on the opposite ends of a central web section 42 so that the card guide associated with one end thereof will receive the upper or top edge of a card associated with the lower or bottom tier while the guide means on the opposite end of the multiple card guide will receive the lower end or edge of a printed circuit card associated with a second or upper tier of printed circuit cards.

Figure 7:
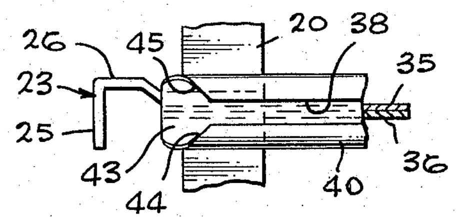
FIGURE 7 is a plan view of the card guide means illustrated in FIGURE 6 taken in the direction of arrows 7—7 thereof showing the specially formed throat of the guide track as provided on each end of a guide means.
Figure 8:
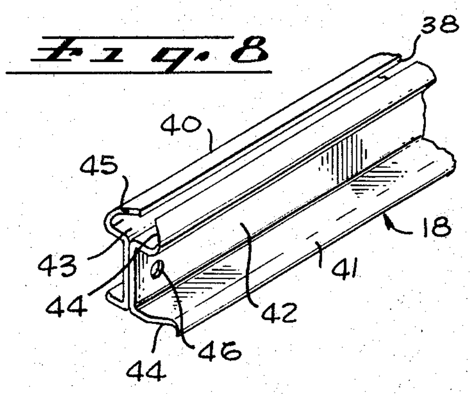
FIGURE 8 is an enlarged perspective view of the novel guide means as incorporated into the card holder illustrated in FIGURE 6.

FIGURE 7 illustrates the relationship between the card guide track on slot 38 and the location of the attachment flange 25 carried by the connector bracket 23 so that the mounting of a connector to the connector bracket will properly locate the receptacle portion of the connector in direct alignment with the slot carried by the guide means. FIGURES 7 and 8 more clearly illustrate the special configuration of an entrance or throat 43 leading into the slot provided in each guide means. The throat is specially formed so that an enlarged opening is initially provided to receive the corner of a circuit card with the opening narrowing towards the center of the guide to provide tapered edges 44 and 45 leading directly into the elongated track 38.

A feature of the invention resides in forming the guide web section 42 with an aperture or hole 46 therethrough on the opposite ends of the guide 18 which is adapted to receive the support rod 16 so as to mount the guide thereon. The importance of this feature as well as the provision of a similar hole in the connector bracket resides in the fact that these parts or elements are included in the modular hardware concept of the present invention. All elements are rigid and are intended to be custom assembled to meet specific specifications which may change from time to time. This concept is entirely different from such prior art racks which are based on snap-lock principles employing resilient components which may be fabricated from plastic materials.

As illustrated in FIGURE 9, another embodiment of a novel card guide element is shown which includes an anti-friction means shown in the form of a pair of plastic inserts 50 and 51, such as may be composed of nylon for example, which are disposed beneath the curl or turn of each arcuate portion of the guide means or element so as to retain the plastic inserts in place. The inserts are separated by a space into which the printed circuit board or card may be easily slid.

With reference to FIGURE 10, another embodiment of the present invention is shown whereby the novel printed circuit board rack is shown adapted for use with a "mother" or master board as illustrated by numeral 52 which has fastened thereon a plurality of connectors, such as electrical connector 53. In this embodiment the flanges 13 and 14 carried by the end plates may be employed for mounting the holder directly to the master board by means of conventional fasteners, such as rivets 54. In this instance, the slot formed in the card guide element is directly aligned with the receptacle portion of each electrical connector so that upon the insertion of a circuit board in the guide means, proper alignment takes place between the leading edge of the board and the receptacle of the electrical connector. To further adjust for any misalignment which may occur, it is noted that a fixed spacer 55 is employed to position the guide means from the end plate 14 and that an adjustable collar 56 is employed on the supporting rod on the other side of the guide element so that upon adjustment of the collar, the guide means can be disposed or displaced along the supporting rod to insure proper alignment of the guide element with respect to the electrical connector. Furthermore, it is also noted in FIGURE 10 that a pair of adjustable collars 57 may be employed to retain the guide means in position whereby the web section of each guide element is retained between the pair of adjustable collars which may be held on the support rod by screws 58.

Therefore, it should now be evident that the present invention has advanced the state of the art through the provision of modular hardware that may be readily assembled together for forming a variety of custom assemblies to receive and store printed circuit boards or cards or the like and that a minimum of individual modular elements or components are employed for meeting a variety of special assembly considerations. The guides may be manufactured as two pieces which are then welded together into a unitary structure or, if desired, the two pieces may be sandwiched together by the end plates on the adjustable spacers. Also, the spacers may be attached directly to the web sections of the guide and cinched thereagainst so as to be integral with the guide, if desired.

While particular embodiments of the present invention have been shown and described, it will be obvious to those skilled in the art that changes and modifications may be made without departing from this invention in its broader aspects, and, therefore, the aim in the appended claims is to cover all such changes and modifications as fall within the true spirit and scope of this invention.

What is claimed is:

1. A printed circuit board rack assembled from modular hardware components comprising:
- a pair of side plates;
- support rods connected between said side plates to rigidly maintain said side plates in fixed spaced parallel relationship;
- a plurality of card guides carried on said support rods so as to provide an upper row and a lower row of said guides;
- each of said guides having a longitudinal track for slidably receiving an edge of a printed circuit card;
- a plurality of spacers carried by said support rods and arranged thereon to separate said guides and to maintain said guides in fixed spaced parallel relationship with respect to each other whereby said tracks of said guides in the upper row oppose said tracks of said guides in the lower row;
- a connector bracket secured on said support rods adjacent one end of each of said guides and having a cantilevered flange extending in line with and transverse to said guide tracks; and
- an electrical connector mounted between a pair of said connector brackets in such a manner that said tracks of said guides slidably receive and retain a circuit board inserted therein and thereby into electrical engagement with said connector.

2. A printed circuit board rack assembled from modular hardware components comprising:
- a pair of side plates;
- support rods connected between said side plates to rigidly maintain said side plates in fixed spaced parallel relationship;
- means for securing each of said support rods to each of said side plates;
- a plurality of elongated rigid card guides having an aperture formed on each end for mountably receiving said support rods so as to provide an upper row and a lower row of said guides;
- each of said guides having a longitudinal track and an enlarged entrance throat leading thereto for slidably receiving an edge of a printed circuit card;
- a plurality of spacers formed from nonconductive material carried by said support rods and arranged thereon to separate said guides and to maintain said guides in fixed spaced parallel relationship with respect to each other whereby said tracks of said guides in the upper row oppose said tracks of said guides in the lower row;
- a rigid connector bracket having a mounting aperture formed therein for mounting to said support rods adjacent one end of each of said guides and having a cantilevered flange extending in line with and transverse to said guide tracks; and
- an electrical connector mounted between a pair of said connector brackets in such a manner that said tracks of said guides slidably receive and retain a circuit board inserted therein and thereby into electrical engagement with said connector.

3. A printed circuit board rack assembled from modular hardware components comprising:
- a pair of support rods arranged in substantially the same plane and spaced apart a distance corresponding to a preselected dimension of a circuit board;
- another pair of support rods arranged in a spaced apart relationship in substantially the same plane and spaced from said first mentioned pair of support rods a distance corresponding to another preselected dimension of the circuit board whereby the circuit board may be removably mounted between said pairs of support rods;
- a pair of circuit board guides each adapted to be mounted on and longitudinally extend between a preselected pair of said support rods and each having a longitudinal track defined on one side thereof to receive and secure a circuit board therein;
- said guides being aligned in the same plane on said support rods and arranged with said tracks opening toward each other to slidably receive the corresponding edges of the circuit board;
- each of said guides having a hole formed adjacent their opposite ends adapted to receive selected ones of said support rods;
- a plurality of spacers carried by each of said supporting rods for spacing said guides apart in fixed spaced relationship whereby the opposing ends of adjacent ones of said spacers butt against opposite sides of each of said guides for clamping each of said guides to each of said supporting rods; and an electrical connector secured adjacent one end of each of said guides and aligned therewith to slidably receive and retain a circuit board inserted therein from the opposite end thereof.

4. The invention as defined in claim 3 wherein the end of each guide opposite said one end thereof includes an enlarged throat entrance formed in said track into which the edge of the circuit board is introduced into said guide.

5. The invention as defined in claim 4 wherein said support rods are mounted between a pair of supporting plates arranged at opposite ends thereof to form a circuit board holding rack; and fastener means for securing the opposite ends of said supporting rods to said supporting plates.

6. A printed circuit board rack assembled from modular hardware components comprising:

a pair of rigid circuit board guides each having a longitudinal track defined on one side thereof and having an enlarged throat entrance leading into said track to slidably receive and secure a circuit board therein;

each of said guides having a hole formed in the opposite ends thereof to receive and mount on each of said guides between a pair of support rods;

a connector bracket having a hole formed therein for mounting on said supporting rods adjacent one end of each guide on the same side thereof as said track and provided with an aperture spaced in alignment with said tracks; and an electrical connector secured at opposite ends to selected ones of said connector brackets by means of said apertures thereon with the tracks of said guides opening toward each other to slidably receive and retain a circuit board inserted therein and thereby into electrical engagement with the connector.

7. The invention as defined in claim 6 wherein each of said guides includes a strip of electrically insulated material secured to each of said guides on opposite sides of said guide track whereby said track is defined by the opposing edge marginal regions of said strips.

8. The invention as defined in claim 7 wherein said strips are fabricated from a plastic-like material and being adapted to serve as an anti-friction slider for releasably gripping a selected edge of a printed circuit board.

9. The invention as defined in claim 8 wherein each of said guides includes a web section having a pair of curled portions cantilevered from one end thereof; said curled portions having opposing terminating ends adapted to secure each of said insulating strips to said guide.

10. A guide for slidably receiving an edge of a printed circuit board comprising:

an elongated metal element having a longitudinal track extending from one end of said element to its opposite end;

said element including a rigid web section and a pair of arcuate sections integrally extending from one side of said web section;

said arcuate sections having opposing terminating ends defining said guide track; and a mounting aperture formed in each end of said element web section for assembling said element onto a rack or holder.

11. The invention as defined in claim 10 including the opposite ends of said element track being formed with an inwardly tapered entrance for receiving the leading end of a selected printed circuit board edge.

12. The invention as defined in claim 11 including a second pair of arcuate sections extending from said web section on its side opposite to its side carrying said first mentioned arcuate sections for slidably receiving a second printed circuit board.

13. The invention as defined in claim 11 including a pair of plastic inserts held by said pair of arcuate sections in fixed spaced relationship having opposing edge surfaces defining said longitudinal track.

14. A printed circuit board rack assembled from modular hardware components comprising:

a pair of rigid circuit board guides each having a longitudinal track defined on one side thereof and having an enlarged throat entrance leading into said track to slidably receive and secure a circuit board therein;

each of said guides having a hole formed in the opposite ends thereof to receive and mount on each of said guides between a pair of support rods;

a connector bracket having a hole formed therein for mounting on said supporting rods adjacent one end of each guide on the same side thereof as said track and provided with an aperture spaced in alignment with said track;

an electrical connector secured at opposite ends to selected ones of said connector brackets by means of said apertures thereon with the tracks of said guides opening toward each other to slidably receive and retain a circuit board inserted therein and thereby into electrical engagement with the connector;

adjustable spacers slidably carried on said support rods between adjacent guides to maintain said guides in fixed parallel spaced relationship; and means operably carried on each of said spacers to detachably secure said spacers to said support rods.

15. The invention as defined in claim 14 wherein selected ones of said spacers are composed of electrically non-conductive materials.

References Cited

UNITED STATES PATENTS 2,931,003 3/1960 Huetten et al. -------- 317—101

ROBERT K. SCHAEFER, *Primary Examiner.*

J. R. SCOTT, *Assistant Examiner.*